United States Patent
Roig-Guitart

(10) Patent No.: US 11,600,611 B2
(45) Date of Patent: Mar. 7, 2023

(54) ELECTRONIC DEVICE INCLUDING HIGH ELECTRON MOBILITY TRANSISTORS AND A RESISTOR AND A METHOD OF USING THE SAME

(71) Applicant: SEMICONDUCTOR COMPONENTS INDUSTRIES, LLC, Phoenix, AZ (US)

(72) Inventor: Jaume Roig-Guitart, Oudenaarde (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/949,735

(22) Filed: Nov. 12, 2020

(65) Prior Publication Data

US 2022/0149037 A1    May 12, 2022

(51) Int. Cl.
*H01L 27/02* (2006.01)
*H01L 29/06* (2006.01)
*H01L 29/778* (2006.01)

(52) U.S. Cl.
CPC ...... *H01L 27/0266* (2013.01); *H01L 27/0288* (2013.01); *H01L 29/0684* (2013.01); *H01L 29/778* (2013.01)

(58) Field of Classification Search
CPC ............. H01L 27/0266; H01L 27/0285; H01L 29/778; H01L 23/60–62
See application file for complete search history.

(56) References Cited

U.S. PATENT DOCUMENTS

| | | | |
|---|---|---|---|
| 10,504,884 B2 | 12/2019 | Roig-Guitart et al. | |
| 2014/0183544 A1* | 7/2014 | Takatani | H01L 29/2003 257/195 |
| 2014/0183609 A1* | 7/2014 | Takatani | H01L 27/0266 257/300 |
| 2015/0001551 A1 | 1/2015 | Kashyap et al. | |
| 2016/0049786 A1 | 2/2016 | Kinzer | |

(Continued)

OTHER PUBLICATIONS

Zhang et al.; "Surge-Energy and Overvoltage Ruggedness of P-Gate GaN HEMTs"; IEEE Trans. on Power Electronics; vol. 35, No. 12; pp. 13409-13419 (2020).

(Continued)

*Primary Examiner* — Matthew C Landau
*Assistant Examiner* — Mark Hatzilambrou
(74) *Attorney, Agent, or Firm* — Abel Schillinger, LLP

(57) ABSTRACT

An electronic device can include a drain terminal, a control terminal, and a source terminal, a first HEMT, and a second HEMT. The first HEMT can include a drain electrode coupled to the drain terminal, a gate electrode coupled to the first control terminal, and a source electrode coupled to the source terminal. The second HEMT can include a drain electrode, a gate electrode, and a source electrode. The drain electrode can be coupled to the drain terminal, and the source electrode can be coupled to the source terminal. In an embodiment, a resistor can be coupled between the gate and source electrodes of the second HEMT, and in another embodiment, the gate electrode of the second HEMT can electrically float. During or after a triggering event, the second HEMT can turn on temporarily to divert some of the charging from the triggering event into the second HEMT.

20 Claims, 5 Drawing Sheets

(56) References Cited

U.S. PATENT DOCUMENTS

2016/0247795 A1\* 8/2016 Pendharkar ......... H01L 27/0255
2019/0199084 A1   6/2019 Bahl
2021/0175226 A1\* 6/2021 Song .................. H01L 27/0277

OTHER PUBLICATIONS

Bahl et al.; "A New Approach to Validate GaN FET Reliability to Power-line Surges Under Use-conditions"; IEEE Int'l Reliability Phys. Symp.; pp. 1 to 5 (2019).

Ming et al.; "A GaN HEMT Gate Drive IC with Programmable Turn-on dV/dt Control"; Proceedings of the 2020 32nd International Symposium on Power Semiconductor Devices and ICs (ISPSD); IEEE; pp. 89-101 (Sep. 13-18, 2020).

Yin et al.; "Research on Driving Technology of GaN HEMT and Application"; 2016 International Symposium on Computer, Consumer and Control; IEEE; pp. 837-840 (2016).

\* cited by examiner

ELECTRONIC DEVICE INCLUDING HIGH ELECTRON MOBILITY TRANSISTORS AND A RESISTOR AND A METHOD OF USING THE SAME

FIELD OF THE DISCLOSURE

The present disclosure relates to electronic devices and methods, and more particularly to, electronic devices that include transistors and methods of using the electronic devices.

RELATED ART

Transistors need to be able to withstand voltage or current surges during transient conditions that are not present when the transistors are operating at steady state. Silicon-based transistors and diodes are over-voltage self-protected due to carrier avalanche effect that clamps the voltage under over-voltage events. The avalanche effect is also observed in SiC and GaN bulk transistors. However, such avalanche effect is not observed in high electron mobility transistors. Accordingly, an over-voltage or over-current condition for high electron mobility transistors may cause permanent damage to a transistor. Further improvements to address transient, over-voltage, or over-current conditions without requiring additional external protections.

BRIEF DESCRIPTION OF THE DRAWINGS

Embodiments are illustrated by way of example and are not limited in the accompanying figures.

Figure 1:
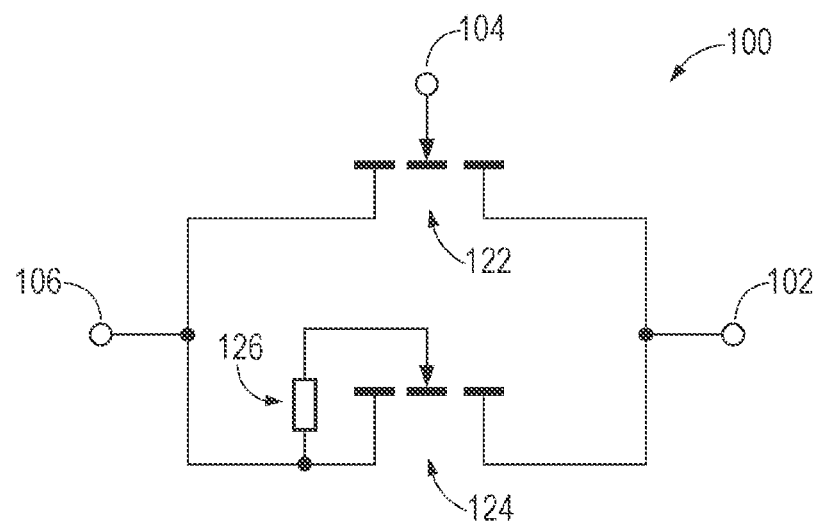
FIG. 1 includes a depiction of a schematic diagram of a circuit in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "electrically coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be partially or completely transferred from one component to another. A subset of "electrically coupled" can include an electrical connection between two electronic components. In a circuit diagram, a node corresponds to an electrical connection between the electronic components. Thus, an electrical connection is a specific type of electrical coupling; however, not all electrical couplings are electrical connections. Other types of electrical coupling include capacitive coupling, resistive coupling, and inductive coupling.

The term "high voltage," with reference to a layer, a structure, or a device, means that such layer, structure, or device can withstand at least 50 V difference across such layer, structure, or device (e.g., between a source and a drain of a transistor when in an off-state) without exhibiting dielectric breakdown, avalanche breakdown, or the like.

With respect directions, the term "lateral" and its variants refer to a direction or dimension along a primary surface of a workpiece or a plane parallel to the primary surface. The primary surface may correspond to a surface of a layer or a substrate within the workpiece. Two components may lie at different elevations and be separated by a distance in an x-axis, a y-axis or both the x- and y-axes, where the x- and y-axes are perpendicular to each other. Lateral dimensions do not consider vertical, or z-axis, offsets.

With respect dimensions, length is measured in a direction along or parallel to a direction corresponding to a principal current flow through a component, region, or layer, and width is measured in a direction perpendicular to length.

The terms "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "steady state" refers to a state in which operation of a circuit or a component within a circuit does not significantly change with time. The term "transient state" refers to a state in which operation of a circuit or a component within a circuit significantly changes with time. For example, a voltage at a node within the circuit may be fluctuating such that voltage swings decrease in amplitude over time, and may be referred to as ringing. After a period of time, a voltage swing becomes insignificant because the amplitude of the voltage swing is a small fraction of the initial amplitude. Thus, the circuit can be in a transient state during ringing and can be at steady state after the ringing becomes insignificant.

Group numbers correspond to columns within the Periodic Table of Elements based on the IUPAC Periodic Table of Elements, version dated Nov. 28, 2016.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A circuit can include a power high electron mobility transistor (HEMT) and a protection HEMT. A drain terminal and drain electrodes of the HEMTs can be coupled to one another, and a source terminal and source electrodes of the HEMTs can be coupled to one another. A gate electrode of the power HEMT can be coupled to a control terminal. In an embodiment, a gate electrode of the protection HEMT can be resistively coupled to the source electrode, and in another embodiment, the gate electrode of the protection HEMT can electrically float. The protection HEMT can be in an off-state until a triggering event occurs. During or after the triggering event, the protection HEMT can be turned on to help divert charge into the protection HEMT and reduce the rate of change of $V_{DS}$ as a function of time and reduce peak $V_{DS}$, as compared to a circuit that does not include the protection HEMT. The protection HEMT may be in the on-state for less than 1 ms after the triggering event.

In an aspect, an electronic device can include a drain terminal, a first control terminal, a source terminal, a first HEMT, a second HEMT, and a resistor. The first HEMT can include a first drain electrode coupled to the drain terminal, a first gate electrode coupled to the first control terminal, and a first source electrode coupled to the source terminal. The second HEMT can include a second drain electrode coupled to the drain terminal, a second gate electrode, and a second source electrode coupled to the source terminal. The first resistor can include a first electrode coupled to the second source electrode, and a second electrode coupled to the second gate electrode.

In another aspect, an electronic device can include a drain terminal, a control terminal, and a source terminal, a first HEMT and a second HEMT. The first HEMT can include a first drain electrode coupled to the drain terminal, a first gate electrode coupled to the control terminal, and a first source electrode coupled to the source terminal. The second HEMT can include a second drain electrode coupled to the drain terminal, a second gate electrode that electrically floats, and a second source electrode coupled to the source terminal.

In a further aspect, a method of using an electronic device can include operating the electronic device. The electronic device can include a drain terminal, a first control terminal, and a source terminal, a first HEMT, and a second HEMT. The first HEMT can include a first drain electrode coupled to the drain terminal, a first gate electrode coupled to the first control terminal, and a first source electrode coupled to the source terminal. The second HEMT can include a second drain electrode coupled to the drain terminal, a second gate electrode, and a second source electrode coupled to the source terminal. The second gate electrode can be resistively coupled to the second source electrode or electrically float. The method can further include turning on the second HEMT in response to a triggering event, wherein the second HEMT is in an on-state for less than 1 ms following the triggering event.

FIG. 1 includes a depiction of a schematic of a circuit 100 that includes a HEMT 122, a HEMT 124, and a resistor 126. A drain terminal 102 for the circuit 100 is coupled to a drain of the HEMT 122 and a drain of the HEMT 124. A control terminal 104 is coupled to a gate of the HEMT 122. An electrode of the resistor 126 is coupled to the gate of the HEMT 124. A source terminal 106 is coupled to the source of the HEMT 124 and the other electrode of the resistor 126. The resistor 126 has a substantially constant resistance over the normal operating voltages of the electronic device.

In the embodiment as illustrated in FIG. 1, each of the HEMTs 122 and 124 is an enhancement-mode HEMT, as illustrated in FIG. 1. The HEMTs 122 and 124 can be normally-off transistors. In another embodiment (not illustrated), each of the HEMTs 122 and 124 is a depletion-mode HEMT. In a particular embodiment, the HEMTs 122 and 124 have substantially the same threshold voltage. In another particular embodiment, the HEMTs 122 and 124 have threshold voltages that are within 0.5 V, within 0.2 V, or within 0.9 V of each other.

Figure 2:
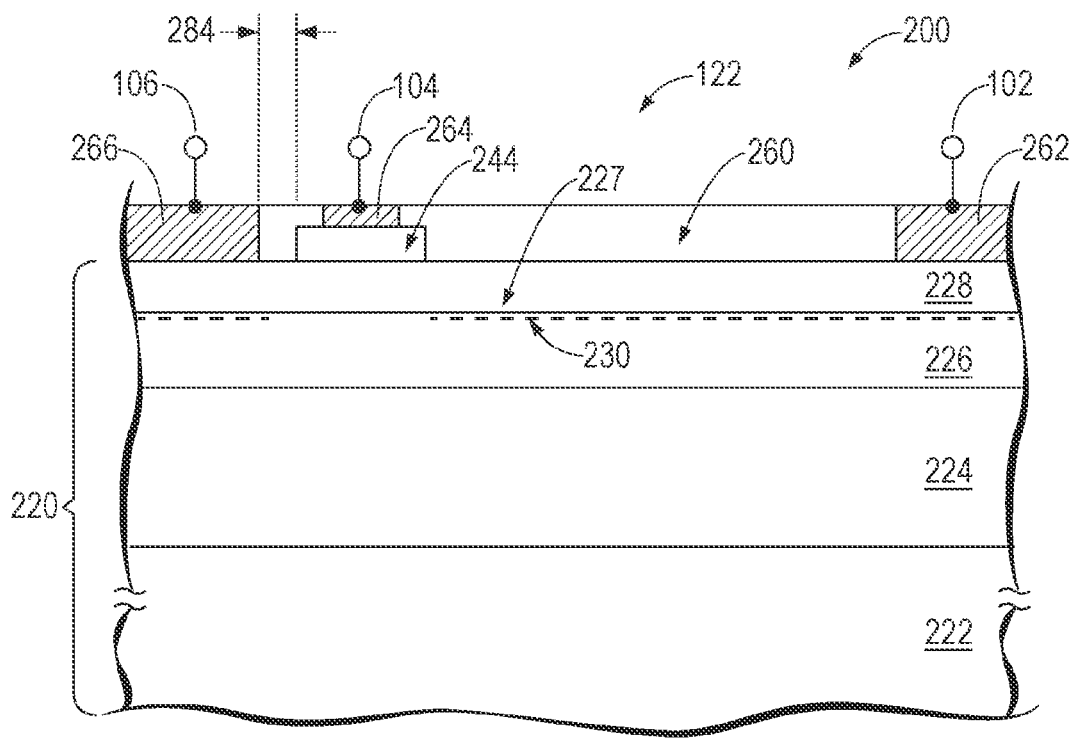
FIG. 2 includes an illustration of a cross-sectional view of a portion of a workpiece that includes a transistor structure for a power high electron mobility transistor.

FIG. 2 includes a cross-sectional view of a portion of a workpiece 200 that includes a physical design for the HEMT 122 in FIG. 1. The workpiece 200 includes a substrate 220 and an interlevel dielectric (ILD) layer 260. The substrate 220 includes a base material 222, a buffer layer 224, a channel layer 226, and a barrier layer 228. The base material 222 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. In an embodiment, the base material 222 can be in the form of a wafer. The buffer layer 224 can be formed over the base material 222 to help with supporting a high voltage and to provide a template for the channel layer 226. The buffer layer 224 can have a thickness in a range from approximately 1 micron to 10 microns.

The channel layer 226 is formed over the buffer layer 224 and the base material 222. The channel layer 226 can include a monocrystalline compound semiconductor material. In an embodiment, the channel layer 226 can include a Group 13-N material, such as $Al_yGa_{(1-y)}N$, wherein $0 \leq y \leq 0.1$. In a particular embodiment, the channel layer 226 includes GaN (in the prior formula, y=0). The channel layer 226 may have a thickness in a range from 10 nm to 2000 nm. The channel layer 226 has a major surface 227.

The barrier layer 228 can include $Al_zGa_{(1-z)}N$, wherein $0.02 \leq z \leq 1$. The barrier layer 228 can have a thickness in a range from 2 nm to 40 nm. The layers 226 and 228 can be formed using an epitaxial growth technique, and thus the layers 226 and 228, and at least a portion of the buffer layer 224 can be monocrystalline. Each of the layers 226 and 228 can be undoped or unintentionally doped with a p-type or an n-type dopant at a dopant concentration less than $5 \times 10^{16}$ atoms/cm$^3$.

A gate electrode 244 of the HEMT 122 can include a p-type semiconductor material. In an embodiment, the gate electrode 244 can include $Al_xGa_{(1-x)}N$, wherein $0 \leq x \leq 1$. The p-type dopant in the gate electrode 244 can include Mg, C, or the like. In an embodiment, the dopant concentration in the gate electrode 244 can be in a range from $1 \times 10^{18}$ atoms/cm$^3$ to $1 \times 10^{21}$ atoms/cm$^3$. The gate electrode 244 can have a thickness in a range from 2 nm to 200 nm.

In the embodiment as illustrated in FIG. 2, the HEMT 122 has a $V_{TH} > 0$ V. A two-dimension electron gas (2DEG) 230 is along the heterojunction between the channel layer 226 and the barrier layer 228 except under the gate electrode 244. When $V_{GS} \geq V_{TH}$, the 2DEG 230 becomes continuous along the heterojunction between the channel layer 226 and the barrier layer 228. The 2DEG 230 extends laterally under all of the gate electrode 244 within the active area of the HEMT 122 when the HEMT 122 is in an on-state.

The ILD layer 260 can include a single film or a plurality of films. The single film or each of the films can include an oxide, a nitride, or an oxynitride. The ILD layer 260 can have a thickness in a range from 20 nm to 2000 nm.

The HEMT 122 further includes a drain electrode 262, a gate interconnect 264, and a source electrode 266. The ILD layer 260 is patterned to define contact openings that extend through the ILD layer 260. The contact openings for the drain and source electrodes 262 and 266 can extend through the ILD layer 260. In an embodiment, the contact openings for the drain and source electrodes 262 and 266 can extend through part, but not all, of the thickness of the barrier layer 228. In another embodiment, the contact openings for the drain and source electrodes 262 and 266 can land on the barrier layer 228 or extend through all of the thickness of the barrier layer 228 and contact the channel layer 226. The contact opening for the gate interconnect 264 can land on the gate electrode 244 or may extend through part, but not all, of the thickness of the gate electrode 244.

A conductive layer can be deposited with the openings and patterned to form the drain and source electrodes 262 and 266 and the gate interconnect 264. The conductive layer can include one or more films including Ti, TiN, Al, Cu, Pd, Pt, W, Au, Ni, or a stack or any combination thereof. In another embodiment, the conductive layer is typically at least 70 wt % aluminum, a noble metal, or an alloy of any of the foregoing. In the drain and source electrodes 262 and 266, the film closest to the barrier layer 228 may be selected for a desired work function.

In an embodiment, patterning of the ILD layer 260 to define the contact openings for the drain and source electrodes 262 and 266 and the formation of the drain and source electrodes 262 and 266 may be performed separately from patterning of the ILD layer 260 to define the contact opening for the gate interconnect 264 and the formation of the gate interconnect 264.

In a further embodiment, the combination of the gate electrode 244 and the gate interconnect 264 can be replaced by a gate dielectric layer and a gate electrode that includes a metal or metal alloy. The gate dielectric layer can be part of the ILD layer 260. The conductive layer for metal or metal alloy gate electrode can include any of the materials as previously described with respect to the drain and source electrodes 262 and 266. In the gate electrode, the film closest to the gate dielectric layer may be selected for a desired work function. Thus, the gate electrode in this embodiment may be formed at a different time and have a different composition as compared to the drain and source electrodes 262 and 266. In another embodiment, the gate electrode 244 may be formed using the same process sequence in forming the drain and source electrodes 262 and 266 or have the same composition as the drain and source electrodes 262 and 266.

Referring to the embodiment of FIG. 2, one or more additional interconnector levels and a passivation layer (not illustrated) can be formed to form a substantially completed device. In a finished device, the drain electrode 262 is coupled to the drain terminal 102, the gate interconnect 264 is coupled to the control terminal 104, the source electrode 266 is coupled to the source terminal 106.

Within the active area, the HEMT 122 has a gate-to-source length ($L_{GS}$) 284 between the gate electrode 244 and the source electrode 266. The significance of the $L_{GS}$ 284 is addressed later in this specification.

Figure 3:
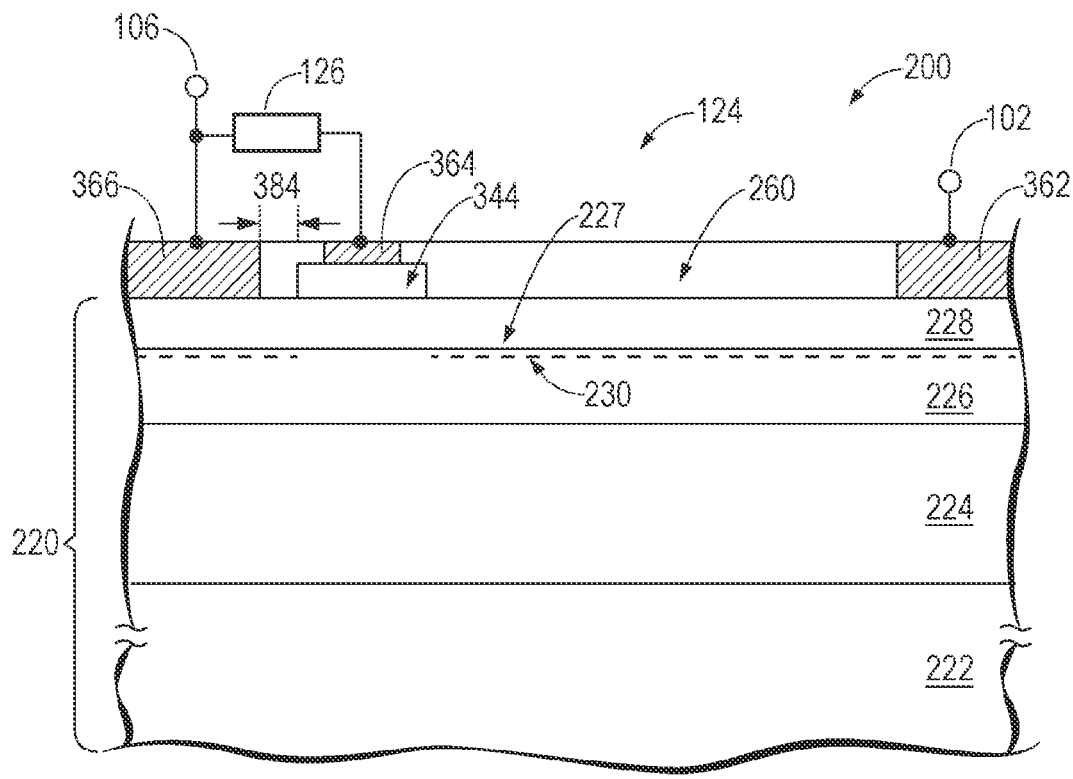
FIG. 3 includes an illustration of a cross-sectional view of another portion of the workpiece that includes a transistor structure for a protection high electron mobility transistor and a resistor.

FIG. 3 includes a cross-sectional view of another portion of the workpiece 200 that includes a physical design for the HEMT 124 and resistor 126 in FIG. 1. The physical design of the HEMT 124 shares many features as previously described with respect to the HEMT 122. The HEMT 124 has a gate electrode 344, a drain electrode 362, a gate interconnect 364, and a source electrode 366.

The gate electrode 344 can include any of the materials and thicknesses described with respect to the gate electrode 244. The gate electrode 344 can have the same composition or a different composition as compared to the gate electrode 244. The gate electrode 344 can have substantially the same thickness or a significantly different thickness as compared to the gate electrode 244.

The drain electrode 362 can include any of the materials and thicknesses described with respect to the drain electrode 262. The drain electrode 362 can have the same composition or a different composition as compared to the drain electrode 262. The drain electrode 362 can have substantially the same thickness or a significantly different thickness as compared to the drain electrode 262.

The gate interconnect 364 can include any of the materials and thicknesses described with respect to the gate interconnect 264. The gate interconnect 364 can have the same composition or a different composition as compared to the gate interconnect 264. The gate interconnect 364 can have substantially the same thickness or a significantly different thickness as compared to the gate interconnect 264.

The source electrode 366 can include any of the materials and thicknesses described with respect to the source electrode 266. The source electrode 366 can have the same composition or a different composition as compared to the source electrode 266. The source electrode 366 can have substantially the same thickness or a significantly different thickness as compared to the source electrode 266.

In an embodiment, the patterning of the ILD layer 260 for the contact openings and formation of the drain and source electrodes 362 and 366 and gate interconnect 364 can be performed using any of the sequences previously described for the drain and source electrodes 262 and 266 and the gate interconnect 264 with respect to FIG. 2.

In the embodiment as illustrated in FIG. 3, the HEMT 124 has a $V_{TH}$>0 V. The 2DEG 230 is along the heterojunction between the channel layer 226 and the barrier layer 228 except under the gate electrode 344. When $V_{GS} \geq V_{TH}$, the 2DEG 230 becomes continuous along the heterojunction between the channel layer 226 and the barrier layer 228. The 2DEG 230 extends laterally under all of the gate electrode 344 within the active area of the HEMT 124 when the HEMT 124 is in an on-state.

Within the active area, the HEMT 124 has an $L_{GS}$ 384 between the gate electrode 344 and the source electrode 366. The $L_{GS}$ 384 can affect gate-to-source capacitance. In an embodiment, the $L_{GS}$ 384 is in a range from 0.7 to 1.3 times the $L_{GS}$ 284. In a particular embodiment, the $L_{GS}$ 384 is substantially the same as the $L_{GS}$ 284.

FIG. 3 further includes the resistor 126. Simulations can be performed to obtain a resistance or range of resistances that can be used for the resistor 126. In an embodiment, the resistance of the resistor 126 can be at least 110 ohms, 500 ohms, or 2 kohms, and in the same or another embodiment, the resistance can be at most 9 Mohms, at most 900 kohms, or at most 90 kohms.

Many different locations can be used for the resistor 126. In the embodiment illustrated in FIG. 4, the resistor 126 is to the right of the source terminal 106. In another embodiment, the resistor 126 can be between the gate interconnect 364 and the side of the source terminal 106.

In still another embodiment (not illustrated), another interconnect level may be used, and the resistor 126 can be within a contact opening. An ILD layer can be formed over the workpiece illustrated in FIG. 3 and patterned to form one or more openings to the gate interconnect 364. The one or more openings can be filled with a resistive material to form the resistor 126. The ILD layer can be patterned to define an opening that exposes a portion of the gate interconnect 364. A resistive material can be formed within the opening. The ILD layer can be patterned to expose portions of the drain and source electrodes 262, 266, 362, and 366. A conductive layer can be formed over the workpiece to form drain interconnects and source interconnects. Each of the drain and source interconnects can include portions that are electrical field electrodes that control the electrical fields in the HEMT 122 and 124 when the HEMTs are in the off-state. The drain interconnects contact the drain electrodes 262 and 362, and source interconnects contact the source electrodes 266, and another source interconnect can contact the source electrode 366 and the resistive material within the opening over the gate interconnect 364. Thus, the resistor 126 corresponds to the resistive material within the opening between the gate interconnect 364 and the source interconnect. In this embodiment, integration of the resistor 126 can occur without taking up any additional area of the electronic device.

The resistor 126 may be at other locations within the die that includes the HEMT 124 without deviating from the concepts as described herein. If needed or desired, the resistor 126 may not be on the same die as the HEMT 124. For example, the resistor 126 can be a discrete component. The description below is based on the HEMT 124 and the variable resistor 126 being on the same workpiece 200.

Figure 4:
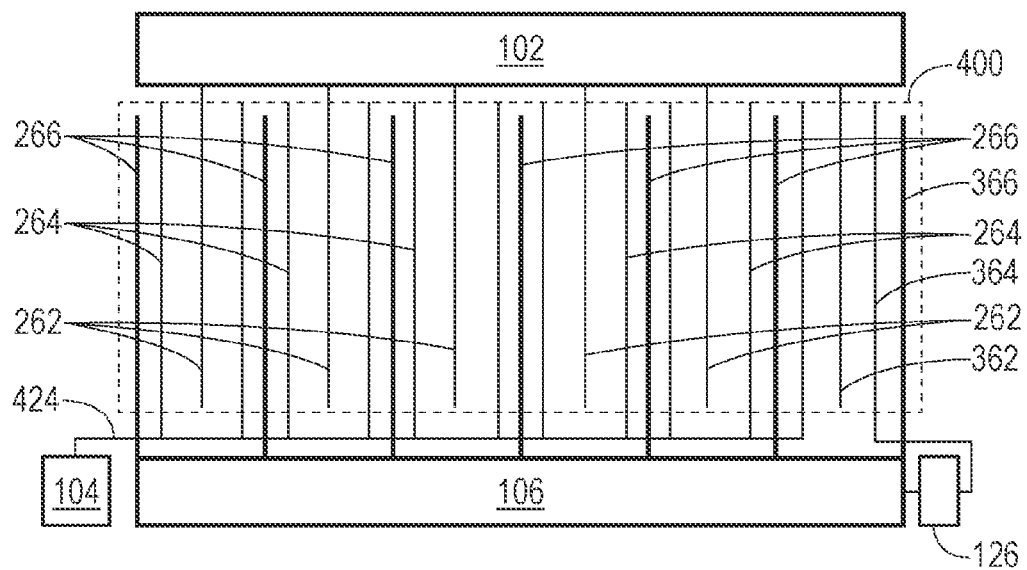
FIG. 4 includes an illustration of a top view of a layout for an electronic device that includes the transistors and resistor in accordance with an embodiment.

FIG. 4 includes a top view of a physical design corresponding to the circuit 100 illustrated in FIG. 1. An active area 400, illustrated as a dashed line, includes the area occupied by the HEMTs 122 and 124. The HEMT 122 includes many transistor structures that include the drain electrodes 262 that are coupled to the drain terminal 102, the gate interconnects 264 that are coupled to the control terminal 104 via a gate runner 424, and the source electrodes 266 that are coupled to the source terminal 106. The gate electrodes 244 (not separately illustrated in FIG. 4) are below the gate interconnects 264 within the active area 400. The portion of the active area 400 that corresponds to the HEMT 124 is near the right-hand side of the active area 400 and includes the drain electrode 362, the gate interconnect 364 and the source electrode 366. The drain electrode 362 is shared by the HEMTs 122 and 124. The remaining portion of the active area 400 corresponds to the HEMT 122.

As the relative amount of the area occupied by, the effective channel width, or both of the HEMT 124 increases, the peak voltage overshoot during a triggering event decreases; however, the current flowing through the HEMT 122 when in an on-state at steady state decreases. As the relative amount of the area occupied by, the effective channel width, or both of the HEMT 124 increases, the current flowing through the HEMT 122 when in an on-state at steady state decreases; however, the rate of change in $V_{DS}$ as of function of time ($\partial V_{DS}/\partial t$) and the peak $V_{DS}$ corresponding to a triggering event decreases.

In an embodiment, the area occupied by the HEMT 124 is at least 0.2%, at least 5%, or at least 11% of the active area 400, and in the same or another embodiment, the area occupied by the HEMT 124 is at most 49%, at most 35%, or at most 30% of the active area 400. In an embodiment, the effective channel width of the HEMT 124 is at least 0.2%, at least 5%, or at least 11% of the combined effective channel widths of the HEMTs 122 and 124, and in the same or another embodiment, the effective channel width of the HEMT 124 is at most 49%, at most 35%, or at most 30% of the combined effective channel widths of the HEMTs 122 and 124. After reading this specification, skilled artisans will be able to determine the relative amount of area or effective channel width of the HEMT 124 to achieve performance characteristics that are needed or desired for the electronic device.

Figure 5:
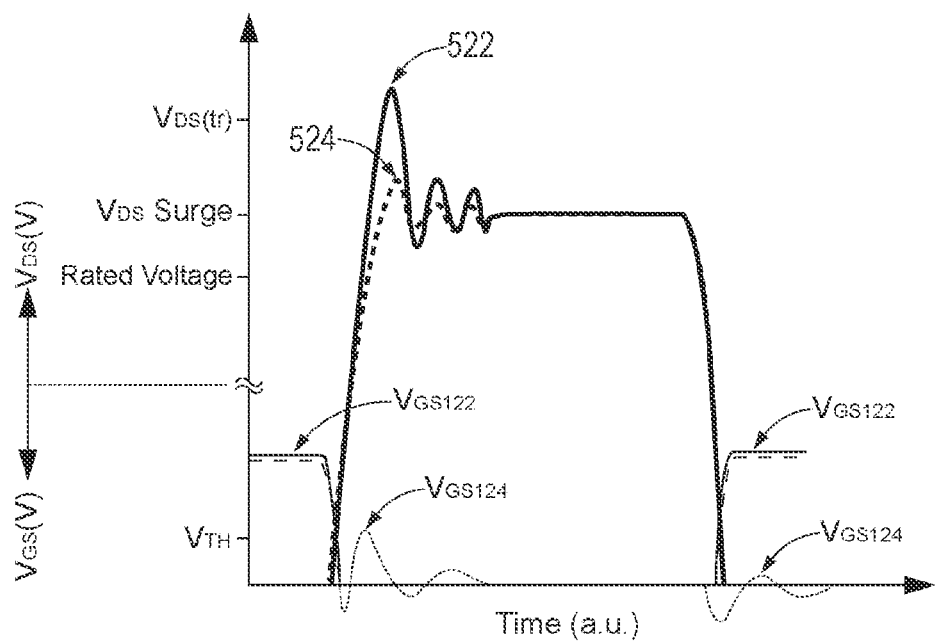
FIG. 5 includes a plot of $V_{DS}$ as a function of time during switching operations for the circuit in FIG. 1.

FIG. 5 includes plots based on a simulation of (1) the HEMT 122 without the HEMT 124 and resistor 126 (HEMT 122-only circuit) and (2) the circuit 100 when the HEMT 124 occupies approximately 20% of the active area 400 and the HEMT 122 occupies the remainder of the active area 400. $V_{GS122}$ corresponds to gate-to-source voltage of the HEMT 122, and $V_{GS124}$ corresponds to the gate-to-source voltage of the HEMT 124.

At the beginning of the plot, the HEMT-only circuit has $V_{GS}$ higher than $V_{TH}$, and the HEMT 122 is in an on-state. When $V_{GS}$ goes to 0 V, the HEMT 122 transitions to an off-state. During or shortly after the HEMT 122 is turned off, $V_{DS}$ (voltage difference between the drain terminal and source terminal of the HEMT-only circuit) goes to a peak $V_{DS}$ 522 and after some oscillation, $V_{DS}$ reaches the steady state $V_{DS}$ when the HEMT-only circuit is in an off-state.

At the beginning of the plot, the circuit 100 has $V_{GS}$ for the HEMT 122 that is higher than $V_{TH}$, and the HEMT 122 is in an on-state. During this time, the HEMT 124 has $V_{GS}$ of 0 V and is in an off-state. When $V_{GS}$ goes to 0 V, the HEMT 122 transitions to an off-state. During or shortly after the HEMT 122 is turned off, $V_{GS}$ of the HEMT 124 can fluctuate and allow the HEMT 124 to turn on and off at least one time. When the HEMT 124 is on, some of the voltage and current surges can be taken up by the HEMT 124. Capacitive current charging $C_{OSS}$ is diverted into the HEMT 124. $V_{DS}$ (voltage difference between the drain terminal 102 and source terminal 106 of the circuit 100) reaches a peak $V_{DS}$ 524. The peak $V_{DS}$ 524 for the circuit 100 is significantly lower than the peak $V_{DS}$ 522 for the HEMT-only circuit. Further, $\partial V_{DS}/\partial t$ is less for the circuit 100 as compared to the HEMT-only circuit. After some oscillation, $V_{GS}$ for the HEMT 124 goes to 0 V, and $V_{DS}$ for the circuit 100 reaches steady state $V_{DS}$ when the circuit 100 is in an off-state. In an embodiment, the HEMT 124 may be on for less than 1 ms, less than 1 μs, or less than 90 ns.

The circuit 100 helps to reduce damage to the HEMT 122 as a result of a triggering event, such as a lightning strike, a switching operation (e.g., load switching capacitor bank switching, or the like), an electrostatic discharge event, an equipment fault for equipment coupled to the electronic device, or other similar events that can expose the circuit 100 to a voltage or current surge.

Figure 6:
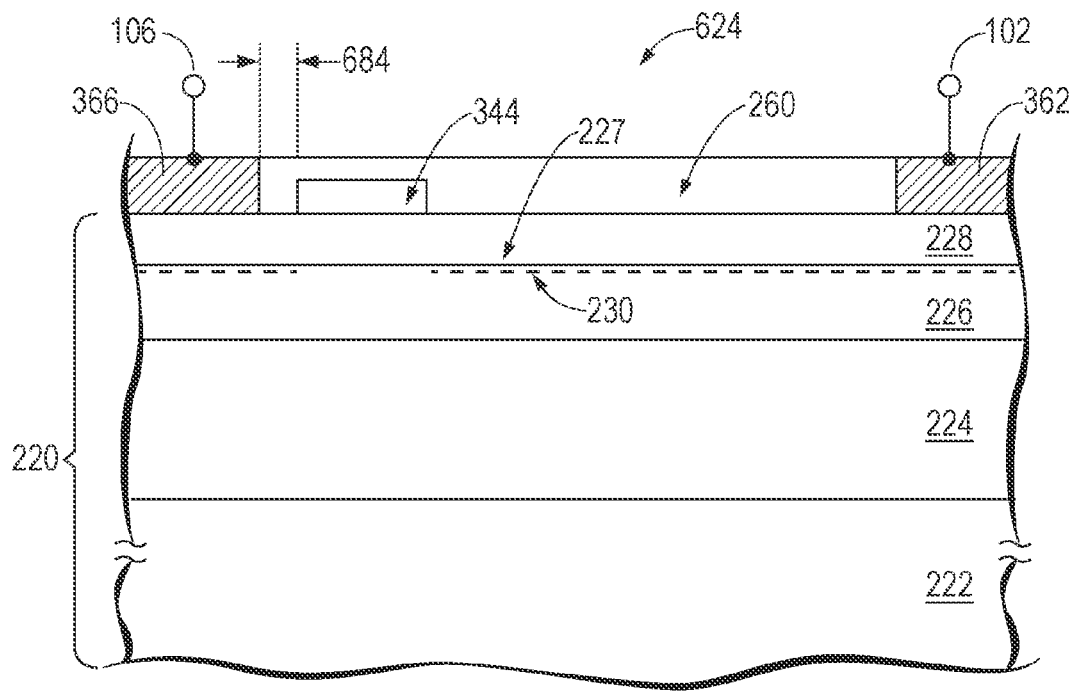
FIG. 6 includes an illustration of a cross-sectional view of a portion of a workpiece that includes a transistor structure for a protection high electron mobility transistor in accordance with another embodiment.

FIG. 6 includes an illustration of an alternative embodiment that includes a HEMT 624 with a gate electrode that electrically floats. As compared to the circuit 100 in FIG. 1, the HEMT 624 replaces the HEMT 124, and the resistor 126 is removed. The HEMT 624 can have any of the layers, materials, thicknesses, and other features as previously described with respect to the structure illustrated and described with respect to FIG. 3 except that the gate interconnect 364 and the resistor 126 are not formed.

The HEMT 624 has an $L_{GS}$ 684 between the gate electrode 344 and the source electrode 366. The $L_{GS}$ 684 affects gate-to-source capacitance. The $L_{GS}$ 684 can be adjusted to allow the HEMT 624 to turn on during a triggering event as previously described. A simulation may be performed to determine $L_{GS}$ 684 that achieves a desired peak $V_{DS}$ during a triggering event. In an embodiment, the $L_{GS}$ 684 is in a range from 0.7 to 1.3 times the $L_{GS}$ 284. In a particular embodiment, the $L_{GS}$ 684 is substantially the same as or less than the $L_{GS}$ 284.

Figure 7:
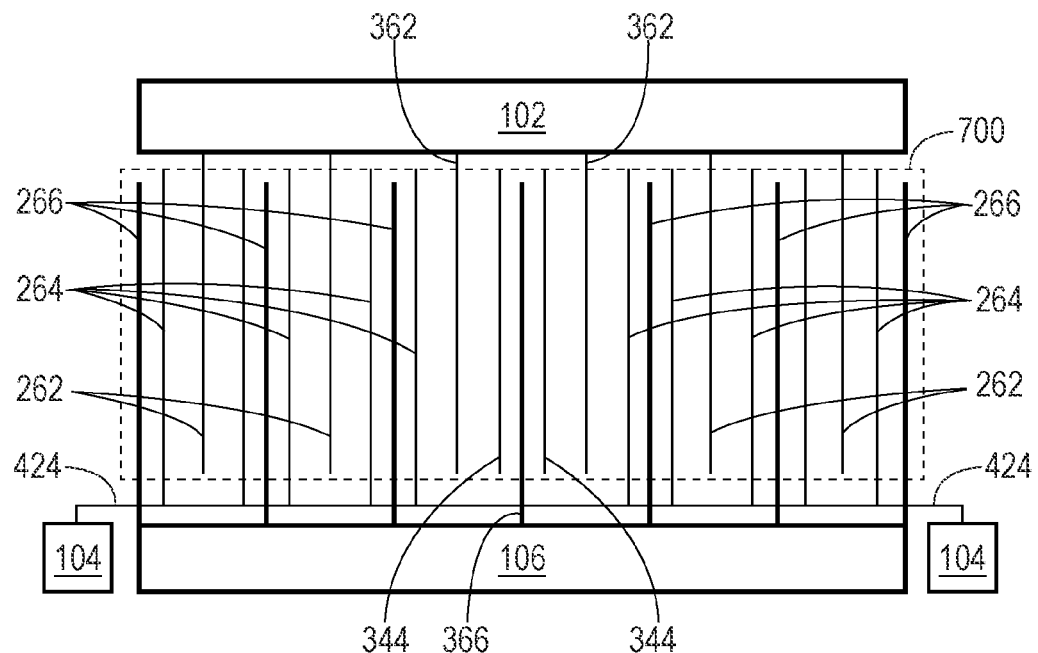
FIG. 7 includes an illustration of a top view of a layout for the variable resistor in accordance with the embodiment of FIG. 6.

FIG. 7 includes a top view of a physical design corresponding to a circuit that includes the HEMTs 122 and 624. An active area 700, illustrated as a dashed line, includes the area occupied by the HEMTs 122 and 624. The transistor structures for the HEMTs 624 may be at a variety of locations within the active area 700. In the embodiment as illustrated, the transistors structures for the HEMT 624 are near the center of the active area 700. The gate electrodes 344 are close to but do not contact the gate runner 424. The HEMT 122 includes many transistor structures that include the drain electrodes 262 that are coupled to the drain terminal 102, the gate interconnects 264 that are coupled to the control terminal 104 via the gate runner 424, and the source electrodes 266 that are coupled to the source terminal 106. Unlike FIG. 4, the gate electrodes 344 in FIG. 7 are not covered by gate interconnects. The drain electrodes 362 are shared by the HEMTs 122 and 624. The remaining portion of the active area 700 corresponds to the HEMT 122.

As the relative amount of the area occupied by, the effective channel width, or both of the HEMT 624 increases, the peak voltage overshoot during a triggering event decreases; however, the current flowing through the HEMT 122 when in an on-state at steady state decreases. As the relative amount of the area occupied by, the effective channel width, or both of the HEMT 624 increase, the current flowing through the HEMT 122 when in an on-state at steady state increases; however, the peak voltage overshoot during a triggering event increases.

In an embodiment, the area occupied by the HEMT 624 is at least 0.2%, at least 5%, or at least 11% of the active area 700, and in the same or another embodiment, the area occupied by the HEMT 624 is at most 49%, at most 35%, or at most 30% of the active area 700. In an embodiment, the effective channel width of the HEMT 624 is at least 0.2%, at least 5%, or at least 11% of the combined effective channel widths of the HEMTs 122 and 624, and in the same or another embodiment, the effective channel width of the HEMT 624 is at most 49%, at most 35%, or at most 30% of the combined effective channel widths of the HEMTs 122 and 624. After reading this specification, skilled artisans will be able to determine the relative amount of area or effective channel width of the HEMT 624 to achieve performance characteristics that are needed or desired for the electronic device.

Figure 8:
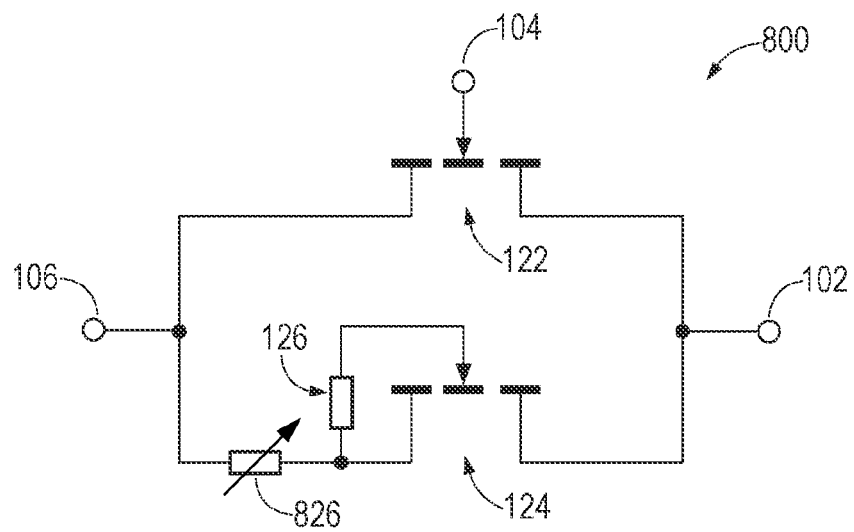
FIG. 8 includes a depiction of a schematic diagram of another circuit in accordance with a further embodiment.

FIG. 8 includes a depiction of a schematic of a circuit 800 that is similar to the circuit 100 in FIG. 1 and adds a variable resistor 826. Unlike the resistor 126, the variable resistor 826 has a resistance that is not constant over the normal operating voltages of the electronic device. For example, the variable resistor 826 may have a resistance that increases as the voltage across the resistor electrodes of the variable resistor 826 is further from 0 V. U.S. Pat. No. 10,504,884 discloses structures, layouts, circuits, and other information related to variable resistors used in conjunctions with HEMTs and is incorporated herein by reference in its entirety.

Figure 9:
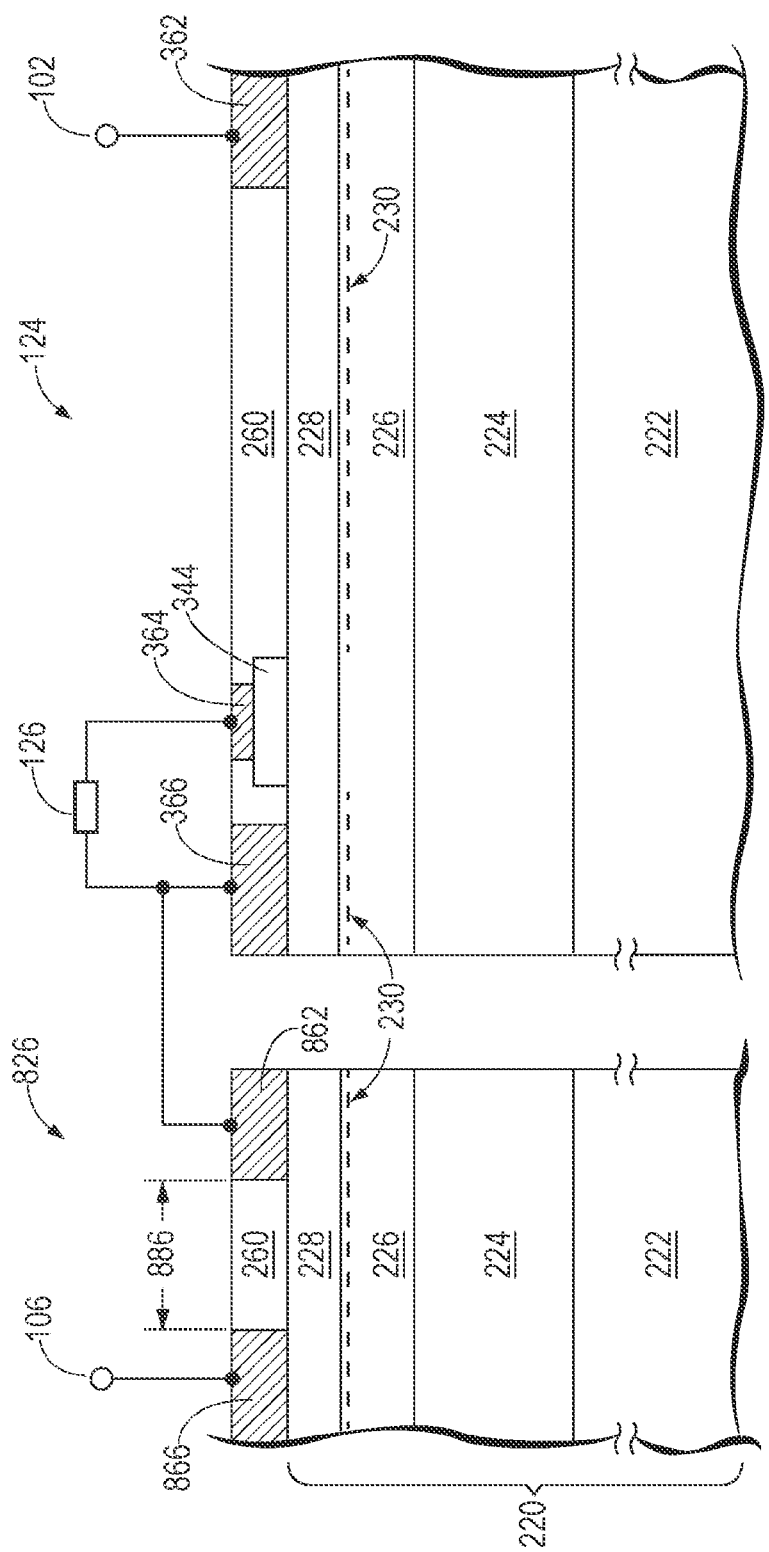
FIG. 9 includes an illustration of a cross-sectional view of a portion of a workpiece that includes a transistor structure for a protection high electron mobility transistor, a resistor, and a variable resistor in accordance with another embodiment.

FIG. 9 includes an exemplary structure that includes the variable resistor 826. The HEMT 124 and resistor 126 are substantially the same as previously illustrated and described with respect to FIG. 3. A transistor structure of the HEMT 124 is in the center and to the right-hand side of FIG. 9. The variable resistor 826 is near the left-hand side of FIG. 9. Resistor electrodes 862 and 866 are spaced apart by a distance 886, and the distance 886 can be selected resistive behavior of the variable resistor 826. Resistor electrodes 862 and 866 can include any of the materials as previously described with respect to the drain and source electrodes 362 and 366. The resistor electrodes 862 and 866 can have the same or different composition as compared to the drain and source electrodes 362 and 366. The resistor electrodes 862 and 866 may be formed during the same or different process sequence used to form the drain and source electrodes 362 and 366.

EXAMPLES

The following examples are provided to demonstrate that a circuit that includes a protection HEMT can help to reduce $\partial V_{DS}/\partial t$ and the peak $V_{DS}$ following triggering event, and that the relative area occupied by the protection HEMT can be tailored to achieve a desired peak $V_{DS}$.

Simulations were performed to compare the circuit 100 with different areas for the HEMT 124 to a conventional circuit. The conventional circuit includes a HEMT that has transistor structures substantially identical to transistor structures of the HEMT 122. The conventional circuit did not include a protection HEMT, such as HEMT 124, or the resistor 126. When comparing the conventional circuit to the circuit 100, the active area of HEMT in the conventional circuit is substantially the same as the active area of the HEMTs 122 and 124 in the circuit 100.

Below is Table 1 that includes a table of area of the HEMT 124 and the peak $V_{DS}$. The area of the HEMT 124 is expressed as a percentage of the active area occupied by the HEMTs 122 and 124, and peak $V_{DS}$ expressed as a percentage of peak $V_{DS}$ for the conventional circuit. The values for peak $V_{DS}$ presented in Table 1 are exemplary and may depend on the resistance of the resistor 126, the current driven through the circuit, and load impedance (for a load coupled to the drain terminal 102).

TABLE 1

| Peak $V_{DS}$ as a Function of Relative Area of HEMT 124 | | | | |
| --- | --- | --- | --- | --- |
| Area HEMT 124 | 0.75% | 7.5% | 15% | 22.5% |
| Peak $V_{DS}$ | 98.6% | 88.8% | 76.7 | 68.2% |

Table 1 shows that the peak $V_{DS}$ can be significantly reduced by including a protection HEMT, such as HEMT 124. After reading this specification, skilled artisans will be able to perform simulations for the current to flow through the HEMTs and load impedance for a particular application to determine values for the relative area to be occupied by the protection HEMT and the resistance of the resistor 126.

Embodiments described herein can help to protect a HEMT during a triggering event, such as a lightning strike, a switching operation, an electrostatic discharge event, an equipment fault, or the like. A protection HEMT can be connected in parallel with a power HEMT. The protection HEMT can be in an off-state until a triggering event occurs. Capacitive charging $C_{OSS}$ can be diverted into the protection HEMT to help reduce $\partial V_{DS}/\partial t$ and peak $V_{DS}$. The protection HEMT can return to an off-state when the power HEMT reaches steady state. In an embodiment, a resistor can be coupled between the source and gate of the protection HEMT, and in another embodiment, the gate of the protection HEMT can electrically float.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. An electronic device can include a drain terminal, a first control terminal, a source terminal, a first HEMT, a second HEMT, and a first resistor. The first HEMT can include a first drain electrode coupled to the drain terminal, a first gate electrode coupled to the first control terminal, and a first source electrode coupled to the source terminal. The second HEMT can include a second drain electrode coupled to the drain terminal, a second gate electrode and a second source electrode coupled to the source terminal. The first resistor can include a first electrode coupled to the second source electrode, and a second electrode coupled to the second gate electrode.

Embodiment 2. The electronic device of Embodiment 1, wherein the second HEMT is an enhancement-mode transistor.

Embodiment 3. The electronic device of Embodiment 1, wherein the second HEMT occupies at most 49% of a combined active area of the first HEMT and the second HEMT.

Embodiment 4. The electronic device of Embodiment 1 can further include a gate runner, wherein the gate runner is electrically connected to the first gate electrode and the first control terminal, and the second gate electrode is not electrically connected to the gate runner.

Embodiment 5. The electronic device of Embodiment 1 can further include a second control terminal, wherein the second terminal of the first resistor is coupled second control terminal.

Embodiment 6. The electronic device of Embodiment 1 can further include a variable resistor having a first electrode and a second electrode, wherein the first electrode of the variable resistor is coupled to the source terminal, and the second electrode of the variable resistor is coupled to the second source electrode.

Embodiment 7. The electronic device of Embodiment 1, wherein the first HEMT has a first gate-to-source length, the second HEMT has a second gate-to-source length, and the second gate-to-source length is in a range from 0.7 times to 1.3 times the first gate-to-source length.

Embodiment 8. The electronic device of Embodiment 1, wherein a resistance of the first resistor is at least 110 ohms.

Embodiment 9. The electronic device of Embodiment 1, wherein a resistance of the first resistor is at most 9 megaohms.

Embodiment 10. The electronic device of Embodiment 1, wherein the first HEMT, the second HEMT, and the first resistor are parts of a same die.

Embodiment 11. The electronic device of Embodiment 1 can further include a gate runner, wherein a plurality of gate structures including the first gate electrode is electrically connected to the gate runner, and the second gate electrode is not electrically connected to the gate runner. Each of the first and second HEMTs can be an enhancement-mode transistor. The second HEMT can occupy an area that is in a range from 11% to 30% of a combined active area of the first HEMT and the second HEMT. The HEMT can have a first gate-to-source length, the second HEMT can have a second gate-to-source length, and the second gate-to-source length can be in a range from 0.7 times to 1.3 times that first gate-to-source length. A resistance of the first resistor can be in a range from 110 ohms to 900 kohms.

Embodiment 12. An electronic device can include a drain terminal, a control terminal, a source terminal, a first HEMT, and a second HEMT. The first HEMT can include a first drain electrode coupled to the drain terminal, a first gate electrode coupled to the control terminal, and a first source electrode coupled to the source terminal The second HEMT can include a second drain electrode coupled to the drain terminal, a second gate electrode that electrically floats, and a second source electrode coupled to the source terminal.

Embodiment 13. The electronic device of Embodiment 12, wherein the second HEMT is a normally-off transistor.

Embodiment 14. The electronic device of Embodiment 13, wherein the first HEMT is a normally-off transistor.

Embodiment 15. The electronic device of Embodiment 12, wherein the first HEMT has a first gate-to-source length, the second HEMT has a second gate-to-source length, and the second gate-to-source length is less than the first gate-to-source length.

Embodiment 16. The electronic device of Embodiment 12 can further include a channel layer and a barrier layer overlying the channel layer. The first drain electrode, the first source electrode, the second drain electrode, and the second source electrode can overlie the channel layer. The first gate electrode and the second gate electrode can overlie the channel layer and the barrier layer.

Embodiment 17. A method of using an electronic device can include operating the electronic device. The electronic device can include a drain terminal, a first control terminal, a source terminal, a first HEMT and a second HEMT. The first HEMT can include a first drain electrode coupled to the drain terminal, a first gate electrode coupled to the first control terminal, and a first source electrode coupled to the source terminal. The second HEMT can include a second drain electrode coupled to the drain terminal, a second gate electrode, and a second source electrode coupled to the source terminal, wherein the second gate electrode is resistively coupled to the second source electrode or electrically floats. The method can further include turning on the second HEMT in response to a triggering event, wherein the second HEMT is in an on-state for less than 1 ms following the triggering event.

Embodiment 18. The method of Embodiment 17, wherein the triggering event is a lightning strike, a switching operation, an electrostatic discharge event, or an equipment fault, wherein the equipment is coupled to the electronic device.

Embodiment 19. The method of Embodiment 17, wherein the second HEMT is in an off-state when the electronic device is operating at steady state.

Embodiment 20. The method of Embodiment 17, wherein a peak $V_{DS}$ for the electronic device in response to the triggering event is at most 0.89 times a peak $V_{DS}$ for another electronic device in response to the triggering event, wherein the other electronic device includes a first transistor having a drain-gate-source configuration that is substantially identical to a drain-gate-source configuration of the first HEMT, and the other electronic device does not include a second transistor having a drain-gate-source configuration that is substantially identical to a drain-gate-source configuration of the second HEMT.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a drain terminal, a first control terminal, and a source terminal;
   a first high electron mobility transistor including:
      a first drain electrode coupled to the drain terminal;
      a first gate electrode coupled to the first control terminal; and
      a first source electrode coupled to the source terminal;
   a second high electron mobility transistor including:
      a second drain electrode coupled to the drain terminal and electrically connected to the first drain electrode of the first high electron mobility transistor;
      a second gate electrode; and
      a second source electrode coupled to the source terminal and electrically connected to the first source electrode of the first high electron mobility transistor; and
   a first resistor including:
      a first electrode coupled to the second source electrode; and
      a second electrode coupled to the second gate electrode.

2. The electronic device of claim 1, wherein the second high electron mobility transistor occupies in a range of 11% to 49% of a combined active area of the first high electron mobility transistor and the second high electron mobility transistor.

3. The electronic device of claim 1, further comprising a gate runner, wherein the gate runner is electrically connected to the first gate electrode and the first control terminal, and the second gate electrode is not electrically connected to the gate runner.

4. The electronic device of claim 1, further comprising a gate interconnect, wherein the gate interconnect is coupled between the second electrode of the first resistor and the second gate electrode of the second high electron mobility transistor.

5. The electronic device of claim 1, further comprising a variable resistor having a first electrode and a second electrode, wherein the first electrode of the variable resistor is coupled to the source terminal, and the second electrode of the variable resistor is coupled to the second source electrode.

6. The electronic device of claim 1, wherein:
   the first high electron mobility transistor has a first gate-to-source length,
   the second high electron mobility transistor has a second gate-to-source length, and
   the second gate-to-source length is the same as the first gate-to-source length.

7. The electronic device of claim 1, wherein a resistance of the first resistor is in a range from 110 ohms to 9 megaohms.

8. The electronic device of claim 1, wherein the first drain electrode of the first high electron mobility transistor and the second drain electrode of the second high electron mobility transistor are a same drain electrode shared by the first high electron mobility transistor and the second high electron mobility transistor.

9. The electronic device of claim 1, further comprising a gate runner, wherein:
each of the first high electron mobility transistor and the second high electron mobility transistor is an enhancement-mode transistor,
the second high electron mobility transistor occupies an area that is in a range from 11% to 30% of a combined active area of the first high electron mobility transistor and the second high electron mobility transistor,
a plurality of gate structures including the first gate electrode is electrically connected to the gate runner,
the second gate electrode is not electrically connected to the gate runner,
the first high electron mobility transistor has a first gate-to-source length, the second high electron mobility transistor has a second gate-to-source length, and the second gate-to-source length is in a range from 0.7 times to 1.3 times that first gate-to-source length, and
a resistance of the first resistor is in a range from 110 ohms to 900 kohms.

10. The electronic device of claim 1, wherein:
the first high electron mobility transistor comprises:
a set of drain electrodes including the first drain electrode,
a get of gate electrodes including the first gate electrode, and
a set of source electrodes including the first source electrode, and
the set of drain electrodes of the first high electron mobility transistor and the second drain electrode of the second high electron mobility transistor are coupled to the drain terminal,
the set of source electrodes of the first high electron mobility transistor and the second source electrode of the second high electron mobility transistor are coupled to the source terminal, and
the set of drain electrodes, the second drain electrode, the set of source electrodes, and the second source electrode are within a same active area.

11. The electronic device of claim 1, wherein:
the first high electron mobility transistor has a first gate-to-source length,
the second high electron mobility transistor has a second gate-to-source length, and
the second gate-to-source length is less than the first gate-to-source length.

12. The electronic device of claim 1, further comprising:
a channel layer; and
a barrier layer overlying the channel layer,
wherein the first drain electrode, the first source electrode, the second drain electrode, and the second source electrode extend at least partly through a thickness of the barrier layer and overlie the channel layer, and the first gate electrode and the second gate electrode overlie the channel layer and the barrier layer.

13. A method of using an electronic device comprising:
operating the electronic device, wherein the electronic device comprises:
a drain terminal, a first control terminal, and a source terminal;
a first high electron mobility transistor including:
a first drain electrode coupled to the drain terminal;
a first gate electrode coupled to the first control terminal; and
a first source electrode coupled to the source terminal;
a second high electron mobility transistor including:
a second drain electrode coupled to the drain terminal and electrically connected to the first drain electrode of the first high electron mobility transistor;
a second gate electrode; and
a second source electrode coupled to the source terminal and electrically connected to the first source electrode of the first high electron mobility transistor; and
a first resistor including:
a first electrode coupled to the second source electrode; and
a second electrode coupled to the second gate electrode; and
turning on the second high electron mobility transistor in response to a triggering event, wherein the second high electron mobility transistor is in an on-state for less than 1 ms following the triggering event.

14. The method of claim 13, wherein the triggering event is a lightning strike, a switching operation, an electrostatic discharge event, or an equipment fault, wherein the equipment is coupled to the electronic device.

15. The method of claim 13, wherein the second high electron mobility transistor is in an off-state when the electronic device is operating at steady state, and, during the triggering event, current flows from the drain terminal to the source terminal via the second high electron mobility transistor.

16. The method of claim 13, wherein a peak $V_{DS}$ for the electronic device in response to the triggering event is at most 0.89 times a peak $V_{DS}$ for another electronic device in response to the triggering event, wherein the other electronic device includes a first transistor having a drain-gate-source configuration that is substantially identical to a drain-gate-source configuration of the first high electron mobility transistor, and the other electronic device does not include a second transistor having a drain-gate-source configuration that is substantially identical to a drain-gate-source configuration of the second high electron mobility transistor.

17. An electronic device comprising:
a drain terminal, a control terminal, and a source terminal;
a power high electron mobility transistor including:
a first drain electrode coupled to the drain terminal;
a first gate electrode coupled to the control terminal; and
a first source electrode coupled to the source terminal;
a high electron mobility transistor including:
a second drain electrode coupled to the drain terminal;
a second gate electrode; and
a second source electrode coupled to the source terminal; and
a resistor including:
a first electrode electrically connected to the source terminal; and
a second electrode electrically connected to the second gate electrode,
wherein the first drain electrode and the second drain electrode are a same drain electrode shared by the power high electron mobility transistor and the protection high electron mobility transistor.

18. The electronic device of claim 17, wherein:
the power high electron mobility transistor comprises:
a set of drain electrodes including the first drain electrode, a set of gate electrodes including the first gate electrode, and a set of source electrodes including the first source electrode, and the set of drain electrodes and the second drain electrode are electrically connected to one another, the set of gate electrodes are electrically connected to one another but not to the second gate electrode, the set of source electrodes and the second source electrode are electrically connected to one another, and the set of drain electrodes, the second drain electrode, the set of source electrodes, and the second source electrode are within a same active area.

19. The electronic device of claim 18, wherein:

each of the set of drain electrodes and the second drain electrode has a proximal end closest to the drain terminal and a distal end along a drain conduction path farthest from the proximal end, each of the set of drain electrodes and the second drain electrode extends in a straight line from its corresponding proximal end to its corresponding distal end, each of the set of source electrodes and the second source electrode has a proximal end closest to the source terminal and a distal end along a source conduction path farthest from the proximal end, and each of the set of drain electrodes and the second drain electrode extends in a straight each of the set of source electrodes and the second source electrode extends in a straight line from its corresponding proximal end to its corresponding distal end.

20. The electronic device of claim 18, wherein:

the set of gate electrodes are coupled to a gate runner, the second gate electrode is not electrically connected to the gate runner, and the set of gate electrodes and the second gate electrode are within the same active area as the set of drain electrodes, the second drain electrode, the set of source electrodes, and the second source electrode.

* * * * *

UNITED STATES PATENT AND TRADEMARK OFFICE
CERTIFICATE OF CORRECTION

| | |
|---|---|
| PATENT NO. | : 11,600,611 B2 |
| APPLICATION NO. | : 16/949735 |
| DATED | : March 7, 2023 |
| INVENTOR(S) | : Jaume Roig-Guitart |

It is certified that error appears in the above-identified patent and that said Letters Patent is hereby corrected as shown below:

In the Claims

Column 15, Line 28, In Claim 10, delete "get" and insert -- set --

Column 16, Line 50, In Claim 17, insert -- protection -- after "a"

Signed and Sealed this
Twenty-third Day of May, 2023

Katherine Kelly Vidal
*Director of the United States Patent and Trademark Office*